(12) United States Patent  
Casper et al.

(10) Patent No.: US 10,621,043 B2  
(45) Date of Patent: Apr. 14, 2020

(54) SYSTEMS, METHODS, AND APPARATUSES FOR STACKED MEMORY

(71) Applicant: Intel Corporation, Santa Clara, CA (US)

(72) Inventors: Bryan K. Casper, Portland, OR (US); Stephen R. Mooney, Mapleton, UT (US); David Dunning, Portland, OR (US); Mozhgan Mansuri, Portland, OR (US); James E. Jaussi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/889,082

(22) Filed: Feb. 5, 2018

(65) Prior Publication Data

US 2018/0232275 A1 Aug. 16, 2018

Related U.S. Application Data

(60) Continuation of application No. 14/622,776, filed on Feb. 13, 2015, now Pat. No. 9,886,343, which is a
(Continued)

(51) Int. Cl.
*G06F 11/10* (2006.01)
*H03M 13/15* (2006.01)
(Continued)

(52) U.S. Cl.
CPC ............ *G06F 11/1076* (2013.01); *G11C 5/02* (2013.01); *G11C 29/12* (2013.01); *H03M 13/152* (2013.01);
(Continued)

(58) Field of Classification Search
None
See application file for complete search history.

(56) References Cited

U.S. PATENT DOCUMENTS 3,273,119 A 9/1966 Helm
5,297,148 A 3/1994 Harari et al.
(Continued)

FOREIGN PATENT DOCUMENTS

CN 1841551 A 10/2006
CN 1845250 A 10/2006
(Continued)

OTHER PUBLICATIONS

Decision to Grant in Japanese Application No. 2012-547101 dated Dec. 2, 2014, 3 pages.
(Continued)

*Primary Examiner* — James G Norman
(74) *Attorney, Agent, or Firm* — Compass IP Law PC

(57) ABSTRACT

Embodiments of the invention are generally directed to systems, methods, and apparatuses for hybrid memory. In one embodiment, a hybrid memory may include a package substrate. The hybrid memory may also include a hybrid memory buffer chip attached to the first side of the package substrate. High speed input/output (HSIO) logic supporting a HSIO interface with a processor. The hybrid memory also includes packet processing logic to support a packet processing protocol on the HSIO interface. Additionally, the hybrid memory also has one or more memory tiles that are vertically stacked on the hybrid memory buffer.

8 Claims, 11 Drawing Sheets

Related U.S. Application Data division of application No. 13/461,324, filed on May 1, 2012, now Pat. No. 8,984,189, which is a continuation of application No. 12/655,590, filed on Dec. 31, 2009, now Pat. No. 8,612,809.

(51) Int. Cl.
  *G11C 29/12* (2006.01)
  *G11C 5/02* (2006.01)

(52) U.S. Cl.
  CPC ... *H01L 2224/16145* (2013.01); *H03M 13/15* (2013.01)

(56) References Cited

U.S. PATENT DOCUMENTS

| | | | |
|---|---|---|---|
| 5,568,437 | A | 10/1996 | Jamal |
| 6,208,581 | B1 | 3/2001 | You |
| 6,373,758 | B1 | 4/2002 | Hughes et al. |
| 7,383,475 | B1 | 6/2008 | Corbin |
| 7,579,683 | B1 | 8/2009 | Falik et al. |
| 7,827,345 | B2 | 11/2010 | Hinrichs et al. |
| 2004/0124539 | A1 | 7/2004 | Yang et al. |
| 2005/0007805 | A1 | 1/2005 | Ware et al. |
| 2005/0007851 | A1 | 1/2005 | Takahashi et al. |
| 2005/0066968 | A1 | 3/2005 | Shofner et al. |
| 2005/0086444 | A1 | 4/2005 | Tanaka |
| 2005/0146919 | A1 | 7/2005 | Ellis et al. |
| 2005/0188230 | A1* | 8/2005 | Bilak .................. G06F 1/3203 713/300 |
| 2006/0227587 | A1 | 10/2006 | Nakamura et al. |
| 2006/0233012 | A1 | 10/2006 | Sekiguchi et al. |
| 2006/0239055 | A1 | 10/2006 | Sonoda et al. |
| 2007/0047284 | A1 | 3/2007 | Silvestri |
| 2007/0067554 | A1 | 3/2007 | Hinrichs et al. |
| 2007/0070669 | A1 | 3/2007 | Tsern |
| 2007/0088995 | A1 | 4/2007 | Tsern et al. |
| 2007/0288683 | A1 | 12/2007 | Panabaker et al. |
| 2008/0136002 | A1 | 6/2008 | Yang |
| 2008/0159022 | A1 | 7/2008 | Kareenahalli et al. |
| 2009/0048819 | A1 | 2/2009 | Norman |
| 2009/0100315 | A1 | 4/2009 | Lee |
| 2009/0103345 | A1 | 4/2009 | Mclaren et al. |
| 2009/0237970 | A1 | 9/2009 | Chung |
| 2009/0282308 | A1 | 11/2009 | Gutsche et al. |
| 2009/0300269 | A1 | 12/2009 | Radke et al. |
| 2009/0300444 | A1 | 12/2009 | Jeddeloh |
| 2009/0321893 | A1 | 12/2009 | Somasekhar et al. |
| 2010/0008058 | A1 | 1/2010 | Saen et al. |
| 2010/0091537 | A1 | 4/2010 | Best et al. |
| 2010/0165692 | A1* | 7/2010 | Jeddeloh ............... G11C 11/406 365/51 |
| 2010/0191999 | A1 | 7/2010 | Jeddeloh |
| 2010/0238693 | A1* | 9/2010 | Jeddeloh ............ G06F 13/4234 365/51 |

FOREIGN PATENT DOCUMENTS

| | | |
|---|---|---|
| CN | 101197360 A | 6/2008 |
| EP | 0644547 A2 | 3/1995 |
| JP | S6465650 A | 3/1989 |
| JP | H02302856 A | 12/1990 |
| JP | 2001067889 A | 3/2001 |
| JP | 2005122823 A | 5/2005 |
| JP | 2005191172 A | 7/2005 |
| JP | 2006277870 A | 10/2006 |
| JP | 2007517354 A | 6/2007 |
| JP | 2007273072 A | 10/2007 |
| JP | 2007280562 A | 10/2007 |
| JP | 2008140220 A | 6/2008 |
| JP | 2009506476 A | 2/2009 |
| JP | 2009510562 A | 3/2009 |
| WO | 2008076790 A3 | 9/2008 |
| WO | 2009006113 A2 | 1/2009 |
| WO | 2009032153 A2 | 3/2009 |
| WO | 2011081846 A2 | 7/2011 |

OTHER PUBLICATIONS

English translation of Final Notice of Preliminary Rejection dated Feb. 28, 2014, in Korean Patent Application No. 2012-7016830, 5 pages.
English translation of Notice of Preliminary Rejection dated Jul. 24, 2013, in Korean Patent Application No. 2012-7016830, 5 pages.
European Search Report for European Application No. 15198043.0 dated May 11, 2016, 8 pages.
Extended European Search Report dated Dec. 6, 2013, in European Patent Application No. 10841482, 10 pages.
First Office Action in Chinese Application No. 201510062141.0 dated Sep. 30, 2016, 11 pages.
First Office Action in Taiwanese Application No. 104134702 dated Dec. 20, 2016, 9 pages.
International Preliminary Report for PCT Application No. PCT/US2010/059853 dated Jul. 12, 2012, 5 pages.
International Search Report and Written Opinion of the International Searching Authority, in International Application No. PCT/US2010/059853, 6 pages.
Japanese Decision to Grant dated Dec. 8, 2015, Japanese Application No. 2014-2627730, 3 pages.
Notice of Allowance (+English Translation) in Korean Application No. 2012-7016830 dated Sep. 29, 2014, 3 pages.
Notice of Rejection Reason dated Jun. 3, 2014, in Japanese Patent Application No. 2012-547101, 4 pages.
Notice to Grant European Application No. 10 841 482.2 dated Jun. 21, 2016, 7 pages.
Notice to Grant in Chinese Application No. 201080054325.8 dated Dec. 14, 2014, 2 pages.
Notification of First Office Action dated Dec. 2, 2013 (+ English translation), in Chinese Patent Application No. 201080054325.8, 15 pages.
Notification of the Second Office Action dated Jul. 2, 2014 (+ English translation), in Chinese Patent Application No. 201080054325.8, 19 pages.
Office Action (+ English Translation) in Japanese Application No. 2015-200976 dated Aug. 23, 2016, 13 pages.
Office Action dated Dec. 17, 2013 (+ English translation), in Japanese Patent Application No. 2012-547101, 8 pages.
Official Action (+English Translation) for Japanese Application No. 2014-262730 dated Dec. 20, 2016, 12 pages.
Official Letter dated Jun. 12, 2015 (+ English translation), in Taiwan Patent Application No. 099144741, 18 pages.
Second Office Action (+English Translation) for Japanese Application No. 2015-20976 dated Dec. 20, 2016, 12 pages.
Taiwanese Decision to Grant dated Jan. 11, 2016 (+English Translation), Taiwanese Application No. 9914741, 2 pages.
Loh, Gabriel H., "3D-Stacked Memory Architectures for Multi-Core Processors", International Symposium on Computer Architecture, 2008 IEEE, pp. 453-464.

* cited by examiner

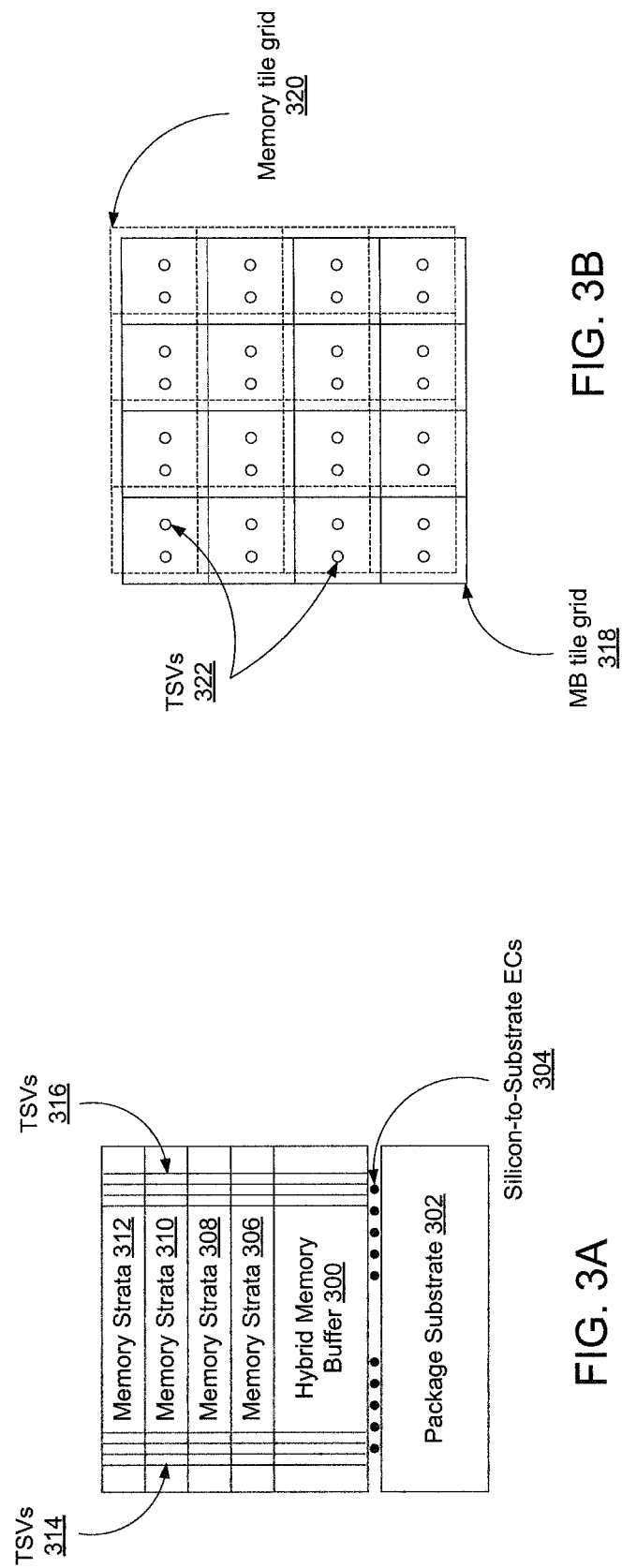

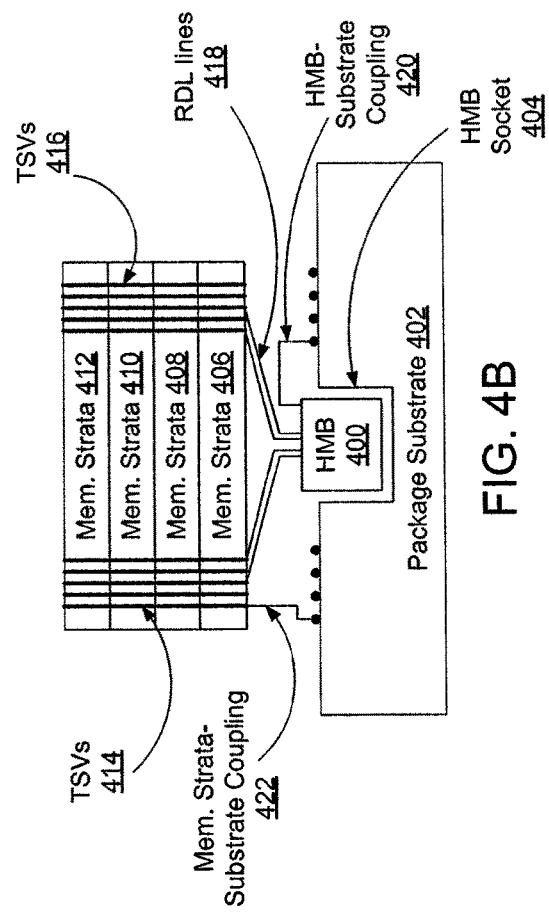
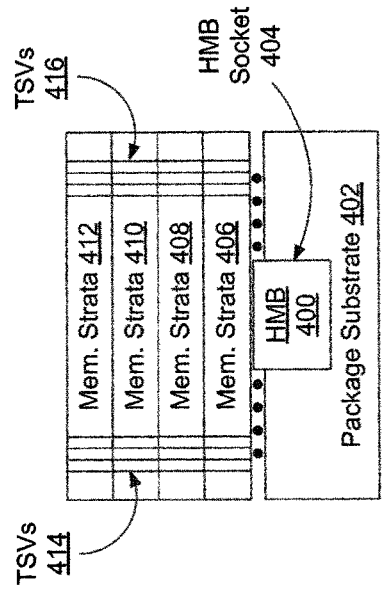
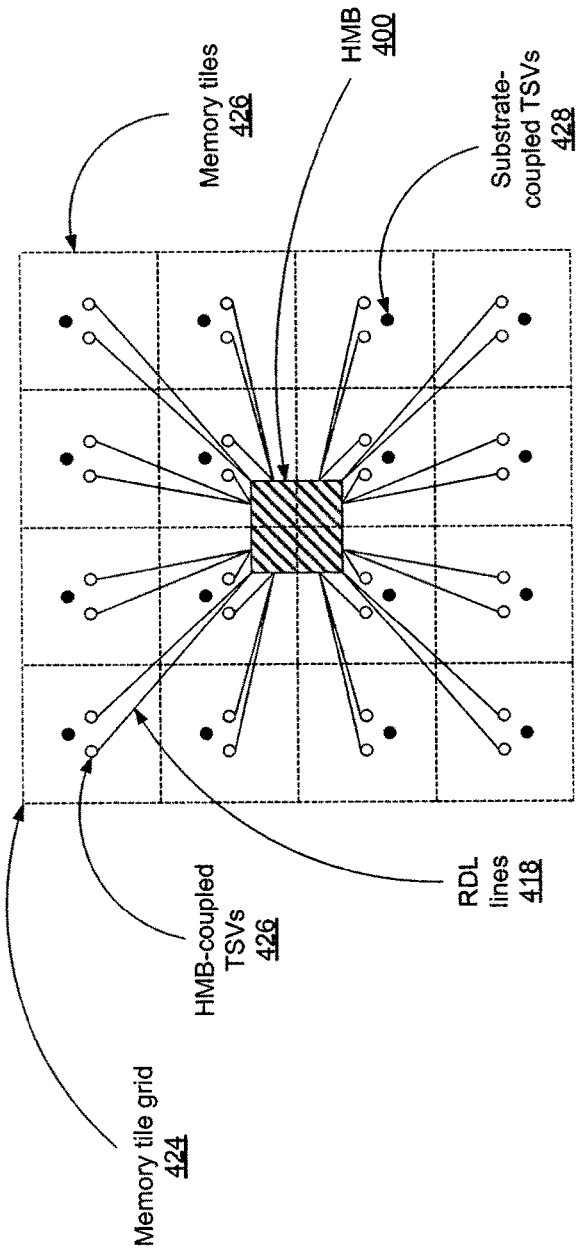

SYSTEMS, METHODS, AND APPARATUSES FOR STACKED MEMORY

CROSS-REFERENCE TO RELATED APPLICATIONS

This application is a continuation of U.S. patent application Ser. No. 14/622,776, filed Feb. 13, 2015, entitled "SYSTEMS, METHODS, AND APPARATUSES FOR STACKED MEMORY", which claims priority to divisional U.S. patent application Ser. No. 13/461,324, filed May 1, 2012, entitled "SYSTEMS, METHODS, AND APPARATUSES FOR STACKED MEMORY" now U.S. Pat. No. 8,984,189; which is a continuation of and claims priority to U.S. patent application Ser. No. 12/655,590, filed Dec. 31, 2009, entitled "SYSTEMS, METHODS, AND APPARATUSES FOR HYBRID MEMORY", now U.S. Pat. No. 8,612,809, issued Dec. 17, 2013; the entire contents of which applications are hereby incorporated by reference.

TECHNICAL FIELD

Embodiments of the invention generally relate to the field of integrated circuits and, more particularly, to systems, methods and apparatuses for hybrid memory.

BACKGROUND

Optimization of memory bandwidth, power efficiency and form factor are becoming increasingly important as memory causes significant bottlenecks to future microprocessor systems. It is common for most CPU systems to utilize a dynamic random access memory (DRAM) based bulk memory solution to provide capacity and bandwidth. However, DRAM process technology is primarily optimized for capacity and cost to the sacrifice of both bandwidth and power efficiency. On the other hand, logic process technology conventionally used for CPUs are optimized for logic density, power efficiency and bandwidth with the drawback being higher cost and lower memory density.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 3A illustrates a side view of an embodiment of a strata-footprint full hybrid memory buffer included in a hybrid memory package.

FIG. 3B illustrates a top view of an embodiment of a strata-footprint full hybrid memory buffer included in a hybrid memory package.

FIG. 4A illustrates a side view of an embodiment of a small-footprint partial hybrid memory buffer included in a hybrid memory package.

FIG. 4B illustrates an exploded side view of an embodiment of a small-footprint partial hybrid memory buffer included in a hybrid memory package.

FIG. 4C illustrates a top view of an embodiment of a small-footprint partial hybrid memory buffer included in a hybrid memory package.

DETAILED DESCRIPTION

Embodiments are generally directed to systems, methods, and apparatuses for implementing hybrid memory.

Figure 1:
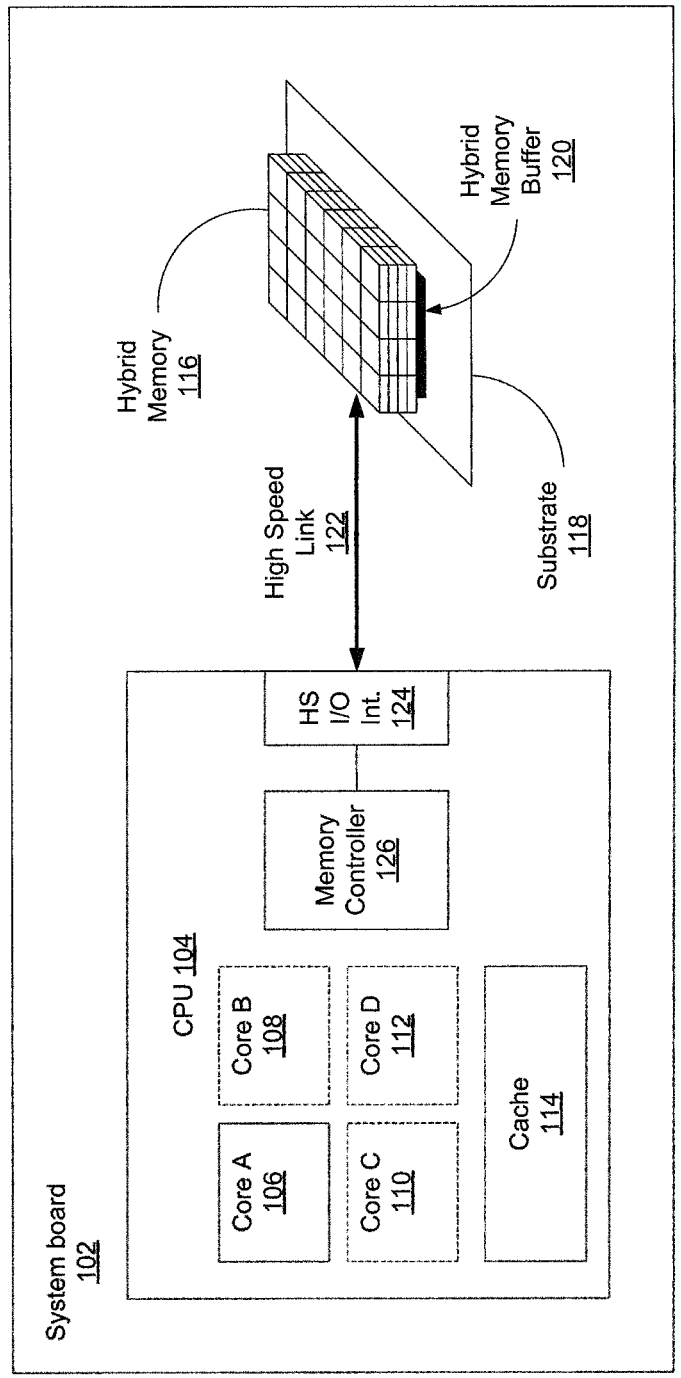
FIG. 1 is a high-level block diagram illustrating selected aspects of a computing system implementing at least one hybrid memory device.

FIG. 1 is a high-level block diagram illustrating selected aspects of a computing system implementing at least one hybrid memory device.

Computer system 100 is shown. The computer system may be a desktop, server, workstation, laptop, handheld, television set-top, media center, game console, integrated system (such as in a car), or other type of computer system. In several embodiments the computer system 100 includes a system board 102 (i.e., motherboard) to couple several components together. For example, the system board 102 may be capable of coupling components through the use of wire traces and specific interfaces. The system board 102 may deliver power to the coupled components. Additionally, the system board may provide a communicative interface to allow multiple components to communicate with each other.

Among the components coupled to system board 102 are one or more central processing units (CPUs). Although in many embodiments there are potentially many CPUs, in the embodiment shown in FIG. 1 only one CPU is shown for clarity, CPU 104. CPU 104 may be Intel® Corporation CPU or a CPU of another brand. CPU 104 includes one or more cores. In the embodiment shown, CPU 104 includes four cores: core A (106), core B (108), core C (110), and core D (112). In other embodiments, CPU 104 may have a number of cores either greater than or less than the four cores shown in FIG. 1. In many embodiments, each core (such as core A (106)) includes internal functional blocks such as one or more execution units, retirement units, a set of general purpose and specific registers, etc. If the cores shown in FIG. 1 are multi-threaded or hyper-threaded, then each hardware thread may be considered as a core as well.

CPU 104 may also include one or more caches, such as cache 114. In many embodiments that are not shown, additional caches other than cache 114 are implemented where multiple levels of cache exist between the execution units in each core and memory. In different embodiments the caches may be apportioned in different ways. Cache 114 may be one of many different sizes in different embodiments. For example, cache 114 may be an 8 megabyte (MB) cache, a 16 MB cache, etc. Additionally, in different embodiments the cache may be a direct mapped cache, a fully associative cache, a multi-way set-associative cache, or a cache with another type of mapping. Each cache may include one large portion shared among all cores in the respective CPU or may be divided into several separately functional slices (e.g., one slice for each core). Each cache may also include one portion shared among all cores and several other portions that are separate functional slices per core.

In many embodiments, CPU 104 is communicatively coupled to one or more hybrid memory devices, such as 116. Hybrid memory comprises a layout of multiple memory tiles stacked vertically and coupled to a substrate 118 at least partially through a hybrid memory buffer 120 attached on the substrate. In many embodiments, the basic structure of a given memory tile may be that of a dynamic random access memory (DRAM).

The hybrid memory 116 device(s) are communicatively coupled to the CPU 104 through a high speed (HS) input/output link 122 (i.e., interconnect, bus, etc.). The HS link 122 is communicatively coupled to the CPU 104 through HS input/output (I/O) interface 124. In different embodiments, the CPU 104 and hybrid memory 116 may communicate through the use of a PCI-Express interface, a fully-buffered dual-inline-memory-module (DIMM) interface, a scalable memory interface (SMI), a proprietary point-to-point interface, such as the QuickPath technology by Intel®, or another such high speed interface.

In many embodiments, the link 122 may include one or more optical wires, metal wires, or other wires (i.e. lines) that are capable of transporting data, address, control, and/or clock information. In many embodiments, the link is a high speed serial interface that includes multiple lanes, each of which transport packetized data between the CPU and hybrid memory 116.

In many embodiments, CPU 104 includes a memory controller 126 to translate information sent and received across the HS link 122. The memory controller 126 is coupled to the HS I/O interface 124 to gain access to the link 122. In other embodiments that are not shown, memory controller 126 may be a discrete device directly coupled to the system board 102 or potentially integrated within another device (e.g., a memory controller hub) that is coupled to the system board 102.

Other devices generally present within computer system 100 are not shown for sake of clarity. These devices may include one or more additional CPUs, a high-performance hub complex that may allow the CPU 104 to be coupled to graphics and/or communication subsystems. Additional components may include one or more I/O complexes housing I/O adapters to translate communications between the CPU and an I/O subsystem comprising I/O devices (e.g., mass storage devices, Universal Serial Bus (USB) devices, etc. Some of the I/O devices may include direct memory access (DMA) capabilities to allow direct access to hybrid memory 116 from such an I/O device through DMA transactions.

Figure 2:
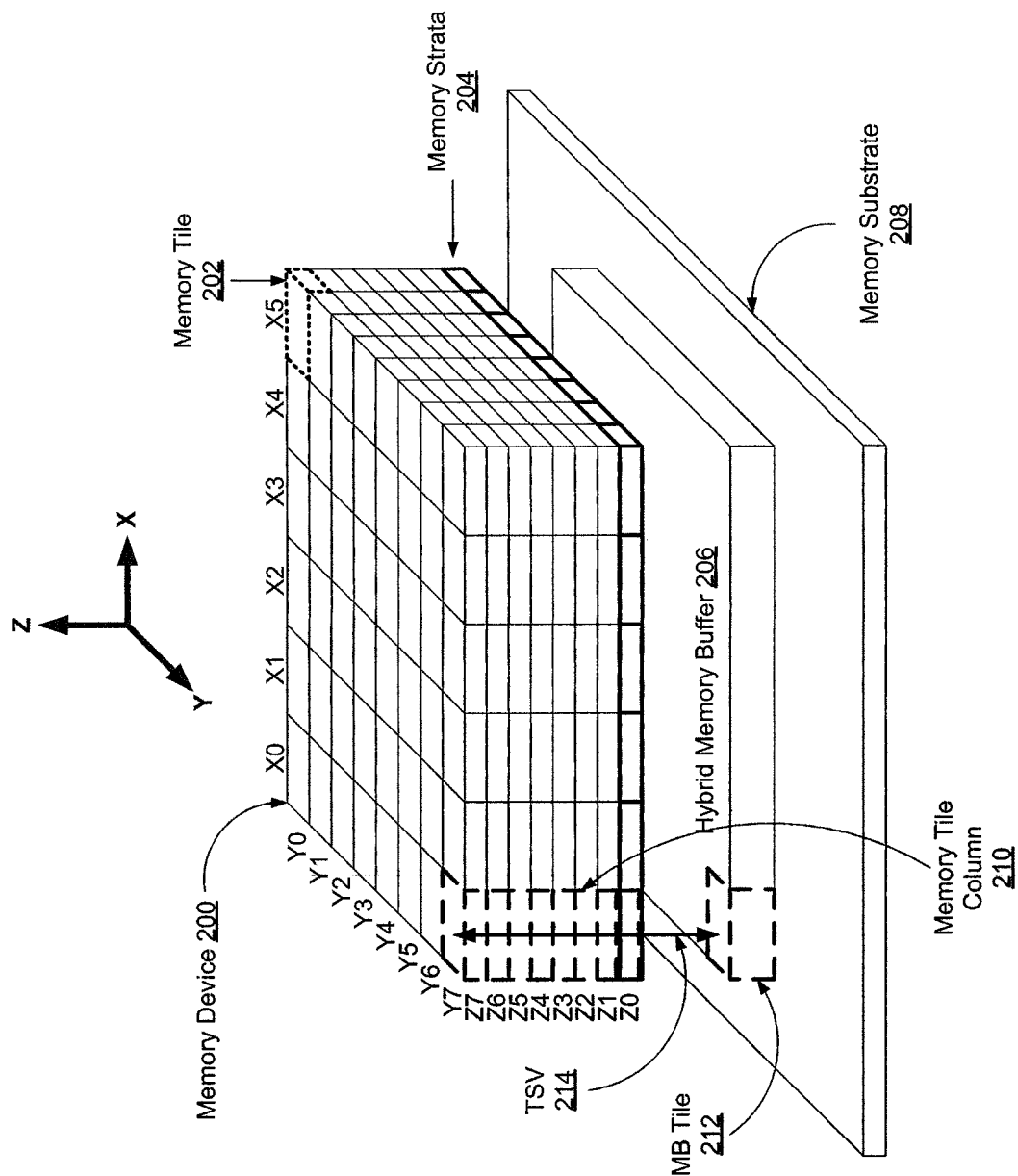
FIG. 2 illustrates a more detailed view of an embodiment of a hybrid memory device.

FIG. 2 illustrates a more detailed view of an embodiment of a hybrid memory device.

Figure 7:
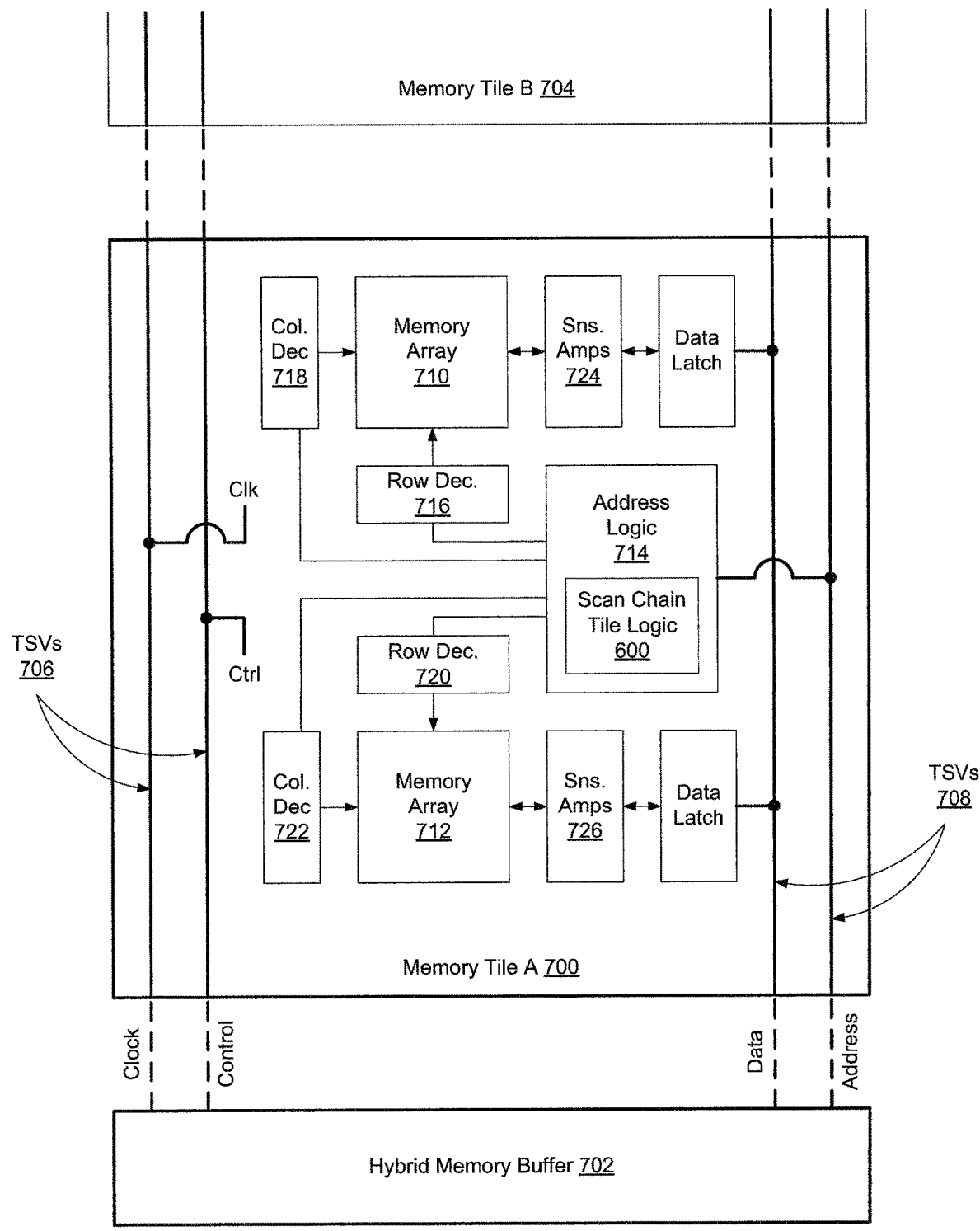
FIG. 7 is a block diagram of an embodiment of a memory tile in a hybrid memory device.

The hybrid memory device 200 structure may comprise many memory tiles, such as memory tile 202. Memory tile 202 includes at least one memory array (i.e. each array within a tile is made up of a grid of bit storage locations, each location addressed through column and row decoders. A detailed block diagram of a memory tile is illustrated in FIG. 7, described below.

Returning to FIG. 2, a grid of memory tiles makes up a single memory strata 204. In FIG. 2, memory strata 204 is specifically indicated by the thicker lines highlighting all the tiles at a single level above the hybrid memory buffer 206 (coupled to the memory substrate 208). More specifically, a memory strata can comprise a grid of any number of memory tiles in the X and Y direction in 3D space (a 3D space coordinate system reference is shown at the top of FIG. 2). For example, in the embodiment shown in FIG. 2, a memory strata, such as memory strata 204 is 6 tiles in the X direction by 8 tiles in the Y direction for a total of 48 tiles per strata.

In many embodiments, there are several memory strata stacked on top of each other. In FIG. 2 there are 8 total strata in the stack. The hybrid memory buffer 206, which is shown at the base of the stack, can comprise one of several forms. The form shown in FIG. 2 is a strata-footprint full hybrid memory buffer that encompasses the same amount of X, Y direction real estate as the memory stratas that are stacked on top of it. In many other embodiments, the hybrid memory buffer comprises a compact size partial hybrid memory buffer that utilizes significantly less space in the X, Y direction than the strata-footprint. The partial hybrid memory buffer is illustrated in FIGS. 4A-4C, which is described below.

Figure 8:
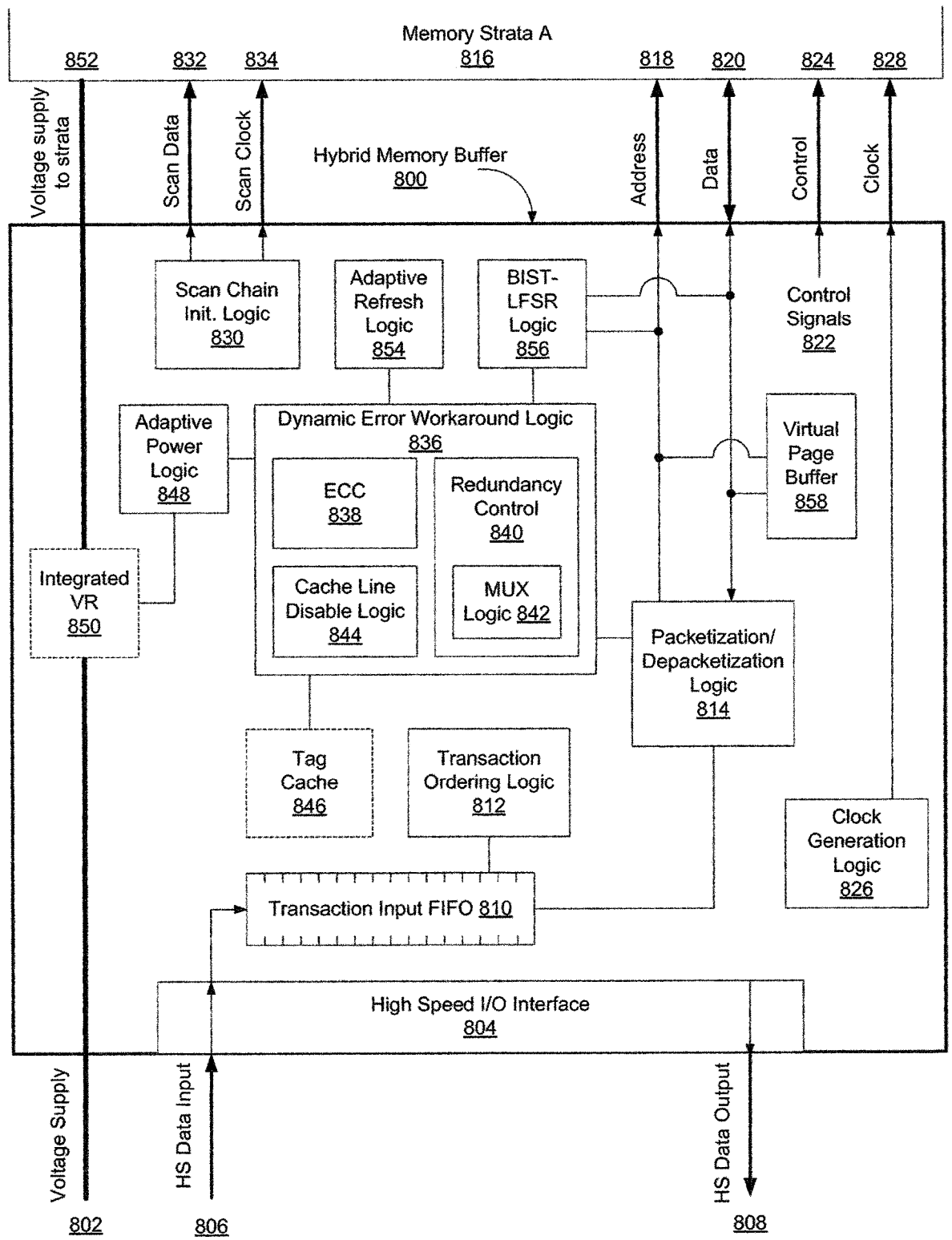
FIG. 8 is a block diagram of an embodiment of the memory buffer in a hybrid memory device.

Regarding the strata-footprint full hybrid memory buffer 206 shown in FIG. 2, under each vertical column of tiles, such as highlighted column X0, Y7 (shown with dashed lines), there resides a memory buffer (MB) tile, such as MB tile 212. A MB tile includes buffer functionality utilized for the memory tiles in the specific column the MB tile is aligned with. In many embodiments, to access the entire memory tile column (e.g. column 210), a set of through silicon vias (TSVs), such as TSV 214 are routed through each tile in each respective strata layer in the column. FIG. 8 illustrates a detailed block diagram of hybrid memory buffer functional blocks, this figure is described in detail further below.

In many different embodiments, the memory substrate 208 may be comprised of one of many types of substrate layouts, though specific example layouts of substrates are not described to aid in the clarity of the discussion.

FIG. 3A illustrates a side view of an embodiment of a strata-footprint full hybrid memory buffer included in a hybrid memory package.

In some embodiments, the full hybrid memory buffer 300 is coupled to the package substrate 302 through S-to-S ECs 304. Additionally, in some embodiments, the S-to-S ECs 304 may comprise a ball grid array (BGA). In other embodiments that are not shown, there may be another type of coupling mechanism utilized (e.g., a pin grid array (PGA)).

The memory strata are directly stacked on top of each other. In the embodiment shown in FIG. 3A, there are four memory strata in the stack: memory strata 306, 308, 310, and 312. In many embodiments, a bonding material is utilized to bond each memory strata to the next memory strata on the stack. The full hybrid memory buffer is coupled to each of the memory strata through the use of TSVs 314 and 316. TSVs 314 and 316 have the capability to deliver power and information (i.e., individual TSVs may deliver data, address, clock, and control signals to the memory strata 306-312 from the full hybrid memory buffer, as well as data from the memory strata 306-312 to the full hybrid memory buffer.

Full hybrid memory buffer 300 may fully control power delivery to each of the memory strata 306-312, due, in part, to the size of the full hybrid memory buffer 300. For example, some of the silicon-to-substrate (S-to-S) electrical connections (ECs) 304 are power delivery lines. In some embodiments the S-to-S ECs 304 comprise solder bumps, though they may comprise other connection technology in other embodiments. Because each and every line routed from the package substrate 302 through the S-to-S ECs 304 arrives at the full hybrid memory buffer 300, the memory buffer may implement a power gating scheme to turn on and power to the entire device comprising the stack of strata, to individual memory strata, or potentially even to individual tiles within a given memory strata.

In other embodiments, the full hybrid memory buffer 300 may include an integrated voltage regulator (VR) that can dynamically modify the voltage supplied to the entire device or a portion thereof. The voltage delivered through the package substrate 302 may originate from a power delivery subsystem located on the system board, which may include several VRs that each deliver power to individual power planes that span portions of the system board.

FIG. 3B illustrates a top view of an embodiment of a strata-footprint full hybrid memory buffer included in a hybrid memory package.

The solid line grid shown in FIG. 3B comprises a set of memory buffer tiles (318). The MB tile grid 318 is shown from this perspective to illustrate the placement of each MB tile in relationship to the bottom memory tile in a column of memory tiles. The MB tile grid 318 is a top-down look at full hybrid memory buffer 300, compartmentalized into the respective MB tiles that full hybrid memory buffer 300 comprises.

The dashed line grid shown in FIG. 3B comprises a set of memory tiles in a first strata directly on top of the MB tile grid 318 (corresponding to memory strata 306). The grid of memory tiles 320 is slightly offset from the MB tile grid 318 specifically to be able to illustrate the two separate grids on top of each other (generally the grids would be aligned per tile.

Also shown in FIG. 3B are the TSVs (322), which, as discussed above, provide a means of delivering power and data between the MB tile grid 318 and the memory tile grid 320. Additional memory tile grids, corresponding to memory strata 308, 310, and 312 would normally be present in FIG. 3B, but are not shown for sake of clarity of the figure.

FIG. 4A illustrates a side view of an embodiment of a small-footprint partial hybrid memory buffer included in a hybrid memory package.

The partial hybrid memory buffer (HMB) 400 is located in a depression carved out from within package substrate 402. The depression may be referred to as a HMB socket 404. In many embodiments, the stack of memory strata (i.e., memory strata 406, 408, 410, and 412) is located directly above HMB 400, though HMB 400 does not span the entire width and length of the grid of memory tile columns in the stack. Rather, HMB 400 resides in the center of the grid of memory tile columns that comprise the memory strata stack. In these embodiments, the HMB 400 may be coupled to the TSVs (e.g., TSVs 414 and 416) through redistribution layer (RDL) lines or another type of coupling mechanism.

The HMB 400 has the potential to be denser and lower cost than the strata-sized memory buffer shown in FIGS. 3A and 3B because there are no width and length size requirements for the HMB 400 chip package. Additionally, because the HMB 400 chip package does not cover the entire width and length of a memory strata, the memory strata stack may receive power directly from the package substrate 402.

In some embodiments, the partial HMB 400 may include an integrated VR that can dynamically modify the voltage supplied to the entire memory stack or a portion thereof. The voltage delivered through the package substrate 402 may originate from a power delivery subsystem located on the system board, which may include several VRs that each deliver power to individual power planes that span portions of the system board.

FIG. 4B illustrates an exploded side view of an embodiment of a hybrid-sized memory buffer included in a hybrid memory package.

FIG. 4B includes the same components as FIG. 4A. The purpose of FIG. 4B is to show specific couplings between the different components in an exploded view. In many embodiments, there are RDL lines 418 that couple the HMB 400 to the TSVs (e.g., TSVs 414 and 416). The RDL lines 418 may be routed throughout the underside of the memory stack to couple each data, address, clock, and control pin originating at the top of the HMB 400 to their respective TSV. In other embodiments, wire bonds are utilized for the coupling mechanism rather than RDL lines.

In many embodiments, additional RDL lines create an HMB-substrate coupling 420. The HMB-substrate coupling 420 is just an illustrative example of one of the potentially many couplings that transfer information and power from the package substrate 402 to the HMB 400. In many embodiments, the HMB 400 sends and receives information across the HS link (122 in FIG. 1) in the form of packets.

Inbound packets arrive at the HMB 400 through the HMB-substrate coupling 420 and outbound packets are sent from the HMB 400 to other components in the computer system through the HMB-substrate coupling 420. Certain RDL lines that make up the HMB-substrate coupling 420 also deliver power to the HMB 400 from the package substrate 402.

In another embodiment that is not shown, the HMB 400 may be coupled to the package substrate through a ball grid array of coupling points on the bottom of the HMB 400. In this embodiment, the HMB socket 404 includes the coupling balls of the array. Though, this particular embodiment may require non-standard electrical routing in the package substrate 402 since the substrate is thinner between the base of the HMB socket 404 and the bottom of the substrate.

As mentioned above in reference to FIG. 4A, using a HMB 400 allows directly coupling the memory strata stack to the package substrate through memory strata-substrate coupling 422. This coupling allows direct power delivery from the package substrate to the memory strata stack instead of relying on power delivery that is routed through the buffer (as is the case in the strata-sized buffer in FIGS. 3A and 3B). The power delivery memory strata-substrate coupling 422 directly couples memory strata 406, the bottom strata in the stack, to the substrate. Power is then delivered up through all of the memory strata in the stack by way of TSVs 414 and 416. Again, the memory strata-substrate coupling 422 in FIG. 4B is an example illustration of a single coupling, though in practice there may be many such couplings throughout the BGA on the substrate with the memory strata stack.

FIG. 4C illustrates a top view of an embodiment of a partial hybrid memory buffer included in a hybrid memory package.

The HMB 400 shown in FIG. 4C is centrally located below the memory strata stack to minimize the required length of the RDL lines 418. The bottom memory strata in the memory strata stack is illustrated by the dashed line memory tile grid 424. The memory tile grid 424 shown includes a 4×4 grid of memory tiles 426.

The HMB 400 is coupled to each memory tile in the grid through the RDL lines 418. These wire bonds 418 are coupled to the HMB-coupled TSVs 426. Additionally, each memory tile in the grid also includes one or more substrate-coupled TSVs 428. In many embodiments, the HMB-coupled TSVs 426 deliver information (i.e., data, address, clock, and control signals) to the memory strata stack. Additionally, in many embodiments, the substrate-coupled TSVs 428 deliver power to the memory strata stack.

Figure 5:
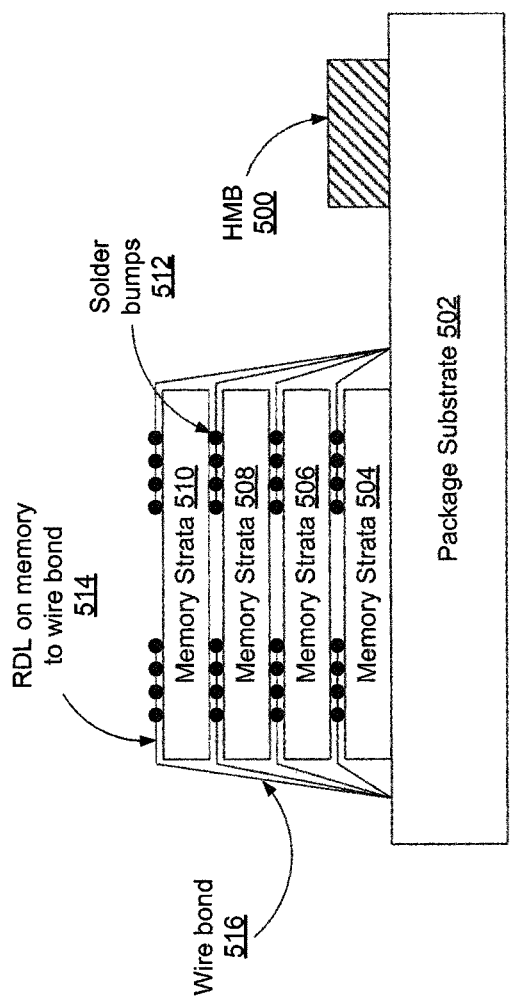
FIG. 5 illustrates a side view of an alternative embodiment of a hybrid memory package.

FIG. 5 illustrates a side view of an alternative embodiment of a hybrid memory package.

The HMB 500 in FIG. 5 is coupled to the package substrate 502 to the side of the memory strata stack including memory strata 504, 506, 508, and 510. Each memory strata in the memory strata stack has a set of solder bumps 512. RDL lines 514 on the top of each memory strata route are routed to the edge of the strata, where wire bonds 516 are used to couple to the RDL lines to the package substrate 502.

Both power and information (i.e., data, address, clock, and control signals) are transferred between the RDL and the substrate using the wire bonds 516. In the embodiments shown, TSVs are not required in the memory strata stack since the delivery of power and information are handled by the wire bonds 516. In other embodiments that are not shown, TSVs may be utilized in the memory strata stack instead of RDL lines and wire bonds.

The information delivery lines are routed from the wire bond couplings at the package substrate 502 to the HMB 500. In many embodiments, the wire bond coupling locations at the package substrate 502 are coupled to the HMB 500 through package substrate traces. Benefits of the memory device package in FIG. 5 include a more straight-forward package substrate 502, without the need of a HMB socket and a lack of TSVs which possibly allow the memory tiles within each memory strata to be more efficiently designed, since several TSVs take up otherwise unnecessary real estate among the circuitry within the memory tiles. Detriments for the memory device package in FIG. 5 may include introducing more complex or lengthy timing requirements between the HMB 500 and the memory strata stack since the HMB 500 is significantly separated from the stack.

In some embodiments, the HMB 500 may include an integrated VR that can dynamically modify the voltage supplied to the entire memory stack or a portion thereof. The voltage delivered through the package substrate 502 may originate from a power delivery subsystem located on the system board, which may include several VRs that each deliver power to individual power planes that span portions of the system board.

Returning to FIG. 2, each memory tile column, such as memory tile column 210 requires an addressing scheme that allows access to specific storage locations within a specific tile. Thus, address schemes utilized by the memory buffer 206 to address a given storage location in the memory column will take into account which tile in the column is being addressed. For example, in FIG. 2, there are 8 tiles in each memory tile column, 3 bits of the address can differentiate between the tile Z0 through tile Z7 in the column.

For stacked configurations, each of the strata would be independently addressed. In some embodiments, point-to-point connections between the memory buffer 206—and each memory strata are utilized. However, point-to-point connections will result in significant area overhead due large number of additional TSVs required to implement a full point-to-point implementation. Another process that may be utilized to independently address each memory tile in the column would be to independently hard code a unique selection word for each stratum using a unique RDL design or top level metal design for each layer of the stack. Though, hard coding results in significant cost and manufacturing overhead.

An alternative to these solutions would be to implement a scan chain process during initialization of the computer system to enable independent addressing at each stratum.

Figure 6:
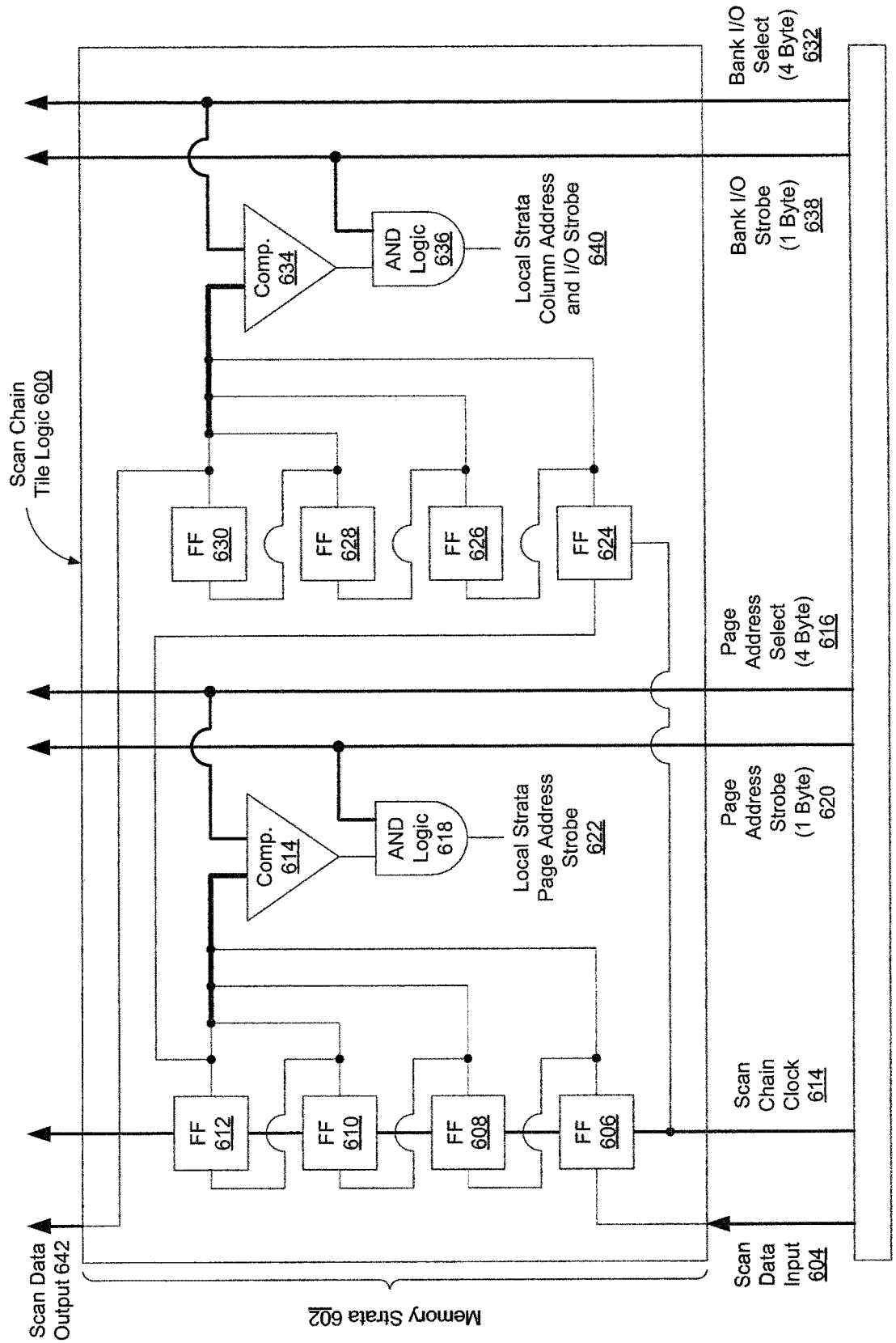
FIG. 6 describes an embodiment of scan chain logic implemented in each memory stratum or memory tile to enable independent addressing dynamically during initialization.

FIG. 6 describes an embodiment of scan chain logic implemented in each memory stratum or memory tile to enable independent addressing dynamically during initialization.

The scan chain logic 600 in FIG. 6 represents an embodiment of the logic included in each memory strata 602 layer and potentially in each memory tile. The logic utilizes a TSV stacking technology in which the through silicon via is processed independently of the metal stack. The scan data input is accessed on one side of the stratum layer while the scan data output is accessed on the other side of the layer. However, both the scan data input and output are physically aligned such that when multiple strata are stacked, the input to one stratum is coupled to the output of another stratum. The scan chain is initialized such that each stratum is programmed with a unique address code which is then used as a comparison reference to the incoming address selection. The dynamic address selection is compared with the static address selection to produce a gating signal for a common strobe signal.

Specifically, a scan data input value 604 enters a chain of flip flops (e.g., FF 606, 608, 610, and 612). The chain of flip flops is fed by the scan chain clock 614. Based on the value of the input 604, the chain of flip flops is programmed with a unique value that corresponds to a unique stratum in the stack. The output from the chain of flip flops is fed into comparator 614, which compares the unique value of bits to certain bits in the page address select lines 616.

The page address select lines 616 are sent through the entire strata stack using TSVs. The particular bits in the page address select lines that are related to the determination of the specific strata the address is referring to are also input into the comparator 614. If these two addresses match, then the comparator 614 output is driven high, otherwise the output value remains low. The comparator 614 output value is fed into AND logic 618.

The other input into AND logic 618 is the page address strobe 620. Thus, if two addresses fed into the comparator 614 match, then the page address strobe 620, fed through the memory strata stack using TSVs, may be utilized at the local strata (strobe 622). If the addresses don't match, then the page address strobe 620 is gated and not capable of being utilized by the local strata 602.

Furthermore, the chain of flip flops may continue with further flip flops 624, 626, 628, and 630. These flip flops also are able to be programmed with a unique address utilizing the scan chain clock 614 and the output from the last flip flop 612 in the previous flip flop chain. In many embodiments, these particular flip flops store a unique bank I/O address that corresponds to certain bits in the bank I/O select lines 632.

The outputs from the chain of flip flops 624-630 are fed into comparator 634, which compares the unique value of bits to certain bits in the bank I/O select lines 632. The bank I/O select lines 632 are sent through the entire strata stack using TSVs. The particular bits in the bank I/O select lines 632 that are related to the determination of the specific strata the address is referring to are also input into the comparator 634. If these two addresses match, then the comparator 634 output is driven high, otherwise the output value remains low. The comparator 634 output value is fed into AND logic 636.

The other input into AND logic 636 is the bank I/O strobe 638. Thus, if two addresses fed into the comparator 634 match, then the bank I/O strobe 638, fed through the memory strata stack using TSVs may be utilized at the local strata (strobe 640). If the addresses don't match, then the page address strobe 640 is gated and not capable of being utilized by the local strata 602.

The output of the last flip flop 630 in the chain is also fed into a scan data output value 642, which is utilized as the scan data input of the next memory strata in the stack. Thus, through programming of this scan chain logic within each strata layer, a unique address can be assigned to each strata, which can be used to gate or not gate the page address strobe and bank I/O strobe supplied to the entire stack. This allows only the strata pointed to by the address to be able to utilize the strobe, and therefore perform memory read and write operations.

In many embodiments, this scan chain logic is programmed by the memory buffer during initialization of the computer system. This dynamic programming at each initialization allows uniform memory tiles to be implemented without any hard coding necessary to program in the memory strata address per tile.

FIG. 7 is a block diagram of an embodiment of a memory tile in a hybrid memory device.

Memory tile A 700 is shown as a tile in the bottom strata of a stack of memory strata since the memory buffer 702 is adjacent to memory tile A. The vertical column of tiles in the stack of strata continues with memory tile B 704 and so on. These tiles are all coupled to the memory buffer 702 through the use of TSVs, such as clock and control TSVs 706 and data and address TSVs 708.

An actual implementation of these TSVs would require many individual TSVs to transport at least the data and address information, but a single TSV line is shown specifically to maintain the clarity of the figure. Furthermore, the routing of the clock and control lines are not specifically shown within memory tile A 700 other than to show that the clk signal and ctrl signals are provided to the memory tile from the TSV traces. This is specifically to simplify the block diagram to also maintain clarity.

As was previously discussed, each memory tile in each strata in the stack may include one memory array or multiple memory arrays. In the embodiment illustrated in FIG. 7, memory tile A 700 includes two separate memory arrays, memory arrays 710 and 712.

In many embodiments, an address is supplied by memory buffer 702 on the address lines that make up the address TSVs. The address is received by address logic 714. Address logic 714 determines whether the address from the memory buffer 702 is referencing a memory location in one of the local memory arrays within memory tile A 700. In many embodiments, this entails utilizing the scan chain tile logic 600 that was set up during initialization of the memory. An implementation of the scan chain tile logic 600 has been discussed above with reference to FIG. 6.

If the address matches a local address location, address logic 714 supplies the row and column decoders for each memory array: row decoder 716 and column decoder 718 for memory array 710 and row decoder 720 and column decoder 722 for memory array 712. The address location in the correct memory array is accessed through these decoders and then data is read from the location in the memory array or written to the location in the memory array.

For example, when data is read from the location in one of the memory arrays, the sense amps (724 and 726 for memory arrays 710 and 712, respectively) are used to sense the voltage level at each bit location so the data can be pulled out and latched in the data latches (728 and 730 for memory arrays 710 and 712, respectively). The data can then be populated onto the TSV data lines and read into the memory buffer 702.

FIG. 8 is a block diagram of an embodiment of the memory buffer in a hybrid memory device.

The memory buffer 800 receives a voltage supply 802 from a package substrate, which may receive voltage from a power delivery plane integrated into the system board in the computer system. In many embodiments, the voltage supply powers the circuitry throughout the memory buffer 800. The memory buffer 800 includes a high speed I/O interface 804 that sends and receives packetized data across a high speed link (such as link 122 in FIG. 1). The high speed link may include HS data input 806 received from the link and HS data output 808 sent to the link.

As described above, the link may comprise a PCI-Express interface, a fully-buffered dual-inline-memory-module (DIMM) interface, a scalable memory interface (SMI), a proprietary point-to-point interface, such as the QuickPath technology by Intel®, or another such high speed interface. In many embodiments, the link has multiple lanes, where each lane is a high speed bi-directional serial interface. In many embodiments, there are many lanes that comprise the entire link (for example, 32 lanes, 128 lanes, 512 lanes, etc.).

In many embodiments, the memory is implemented on a transactional basis. Thus, a memory read request may be sent from the CPU (104 in FIG. 1) without regard to when the request will be completed. These transactions may be packetized and sent across the high speed link. In many embodiments, the transactions may be optimized through a reordering process.

For example, three transactions are received in a certain order from the HS link. These three transactions are input into the transaction input first-in-first-out (FIFO) buffer 810. If the first and third transactions received are requesting data from the same page of memory, but the second transaction utilizes a different page, transaction ordering logic 812 may realize that by flipping the order of the second and third transactions less memory pages would be required to be closed and opened. This works well in a transactional memory system where each transaction is viewed atomically without regard other transactions.

Once transactions are received and potentially reordered within the transaction input FIFO buffer 810, the transactions are then processed by packetization/depacketization (P/D) logic 814. P/D logic 814 takes the specific memory transactions out of the packets and transitions them to a basic address/data format utilized by the memory tiles in the strata, such as memory strata A 816. In other embodiments that are not shown, the P/D logic 814 is located on the HS I/O interface 814 side of the transaction input FIFO 810. In these embodiments, the transaction ordering logic 812 is more generally considered a memory access reordering logic because specific depacketized memory transactions are reordered, rather than packets.

When the D/P logic 814 depacketizes a memory transaction received from the HS link, the address and data are provided to the memory stack through TSVs. Specifically, address TSVs 818 as well as data TSVs 820. In many embodiments, the data lines are combined and are able to perform write operations by feeding data from the memory buffer 800 to a memory location in the memory strata stack as well as perform a read operation by feeding data from a memory location in the memory strata stack to the memory buffer 800.

Additionally, the memory buffer 800 also may generate several control signals 822 from one or more of the functional blocks shown in the buffer. These control signals are output to the memory strata stack through control TSVs 824. Memory buffer 800 also includes clock generation logic 826 to generate a clock signal provided to memory strata stack through clock TSV 828.

The memory buffer 800 may also include scan chain initialization logic 830 to provide the scan data 832 and scan clock 834 utilized by the scan chain tile logic described in FIG. 6. The scan chain initialization logic 830 may perform the scan chain initialization when the computer system boots.

In many embodiments, the memory buffer 800 includes several components that enable dynamic workarounds for errors that show up in the memory device. At the smallest granularity, an error comprises an incorrect result when reading a memory location. These errors may be hardware errors that involve failed components in the memory tiles (e.g., an electrical failure of a sense amp) or soft errors that result from cosmic rays causing a temporary malfunction of hardware. Hard errors are generally permanent errors that exhibit repeatable results when tested, whereas soft errors are generally one time only errors.

In many embodiments, failures of hardware components in the memory may be due in part to a modification in the delivery of power to the memory device. For example, in a low power state, the voltage fed to the memory strata may not be sufficient to maintain a charge in each memory cell. If a charge cannot be maintained, failure of the memory will occur. Alternatively, if the refresh rate of memory is decreased in frequency past the point where the charge in a given memory cell sufficiently diminishes, failure of the memory will also occur. The refresh rate of memory and the power supplied to memory are related. The greater amount of power supplied to memory, the less frequent the memory cells require to be refreshed because the charge takes longer to dissipate. Conversely, the lesser amount of power supplied to the memory, the greater the frequency the memory cells require to be refreshed.

In many embodiments, the memory buffer 800 includes dynamic error workaround logic 836, which provides several capabilities to minimize the impact of errors that appear in the memory. Error checking and correction (ECC) logic 838 provides code to check for errors as they appear in memory and attempts to correct the errors. In some embodiments, some errors may allow for this form of correction. For example, the memory buffer 800 may incorporate a type of BCH (Bose, Ray-Chaudhuri, and Hocquenghem) error correcting code, which potentially has the ability to correct a single bit errors and detect double bit errors within a 128-bit block boundary. Though, in many embodiments where hard errors are present (e.g., a certain column in a memory tile is presenting incorrect data), a number of more robust workarounds may be utilized.

In some embodiments, redundancy control logic 840 may permanently shut down portions of a memory array. For example, if several bits in a specific memory column are repeatedly coming up with bad test results, the redundancy control may permanently shut down that particular column. Specifically, a row of memory may only require 32 bits, but the actual memory array may implement 33 bits. Thus, redundancy logic may look across all columns and determine which one exhibits the largest number of repeating errors. This determined column may be permanently disabled and the other 32 bit-wide columns may be utilized for the memory rows.

Redundancy logic includes multiplexer (MUX) logic 842 which keeps track of which columns or rows may be shut down on a per array basis. The redundancy control 840, during initialization, may lock out the unused columns and rows per array. In other embodiments, the MUX logic 842 may store information about memory cells at a finer or coarser granularity than a per array basis.

Apart from redundancy control logic 840, the dynamic error workaround logic may also implement cache line disable logic 844, which incorporates the ability to disable memory pages or rows. To utilize the cache line disable logic 844, the memory buffer would additionally implement a tag cache 846. The tag cache 846 would specifically be useful to enable a hardware-controller first level memory or last level cache. For example, when a two level memory system is implemented in a computer system, the first level memory is optimized for power efficiency and bandwidth but may have moderate capacity due to cost constraints. The second level memory may be optimized for cost and capacity but not necessarily for bandwidth and power efficiency.

The separate levels of memory in a two level memory scheme generally are not visible to the CPU. This provides modularity and compatibility and also enables a unified memory interface that can talk to far memory, near memory or 2 level memory.

Figure 9:
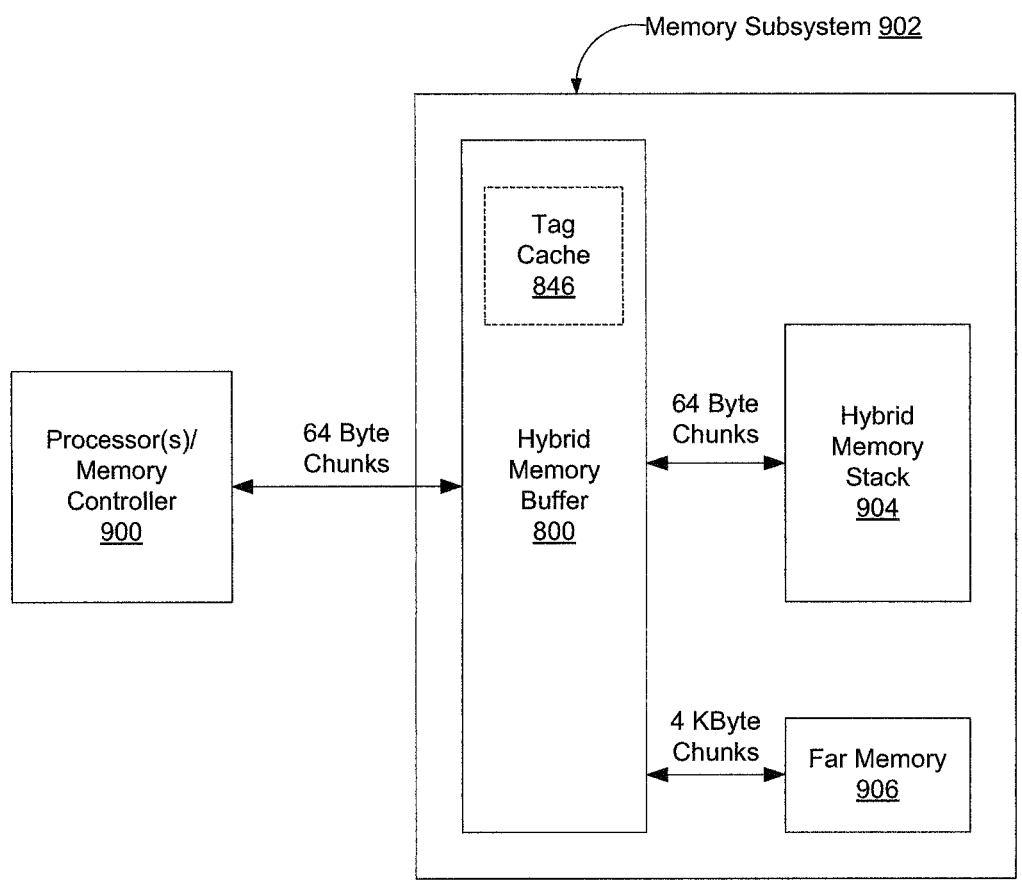
FIG. 9 illustrates an embodiment of a two-level memory system utilizing a hybrid stacked memory.

FIG. 9 illustrates an embodiment of a two-level memory system utilizing a hybrid stacked memory.

The two-level memory system in FIG. 9 includes a processor with a memory controller 900. The processor/memory controller 900 send and receive data with a memory subsystem 902. The memory subsystem includes a hybrid memory buffer 800 that has a tag cache 846. The hybrid memory buffer 800 is coupled to a memory strata stack 904 and a far memory 906. In many embodiments, the memory tiles that comprise the hybrid memory stack are DRAM-based devices. In different embodiments, the far memory may be a non-volatile memory, a phase change memory, or another type of memory technology.

In many embodiments, the data is transferred between the processor/memory controller 900 and the hybrid memory buffer in 64 Byte chunks, which is the same size of the data chunks that pass between the hybrid memory buffer and the hybrid memory stack 904. In many embodiments, 64 Byte blocks are the smallest granularity that data is stored in the hybrid memory stack, whereas with far memory the data may be stored in 4 Kilobyte blocks, which causes 4 Kbyte chunks of data to be transferred between the hybrid memory buffer 800 and the far memory 906.

The tag cache 846 may store an address tag for each far memory block (which are 4 Kbytes in size in this example). Each tag would also be accompanied by a valid bit, a dirty bit, a pseudo LRU tag and a cache line disable bit. Following a tag hit, hybrid memory buffer 800 fetches a 64 Byte block from the hybrid memory stack 904 (first level memory). In response to a tag miss, a 4 KByte block would be fetched from the far memory 906 (second level) and stored in the hybrid memory stack 904.

Additionally, the desired 64 Byte block would be forwarded to the processor/memory controller 900 and the appropriate tag way would be replaced. The replacement policy would prioritize invalid ways in the hybrid memory stack 904 and may be based on a standard pseudo least recently used (LRU) approach. Ways that had the cache line disable bit asserted would be avoided. Thus, cache lines that exhibit hard errors may be disabled from further use in this way in a two-level memory system.

Returning to FIG. 8, the cache line disable logic 844 may use the tag cache 846 in the above described way to implement the cache line disable policy.

In many embodiments, the power delivery to the hybrid memory stack may be adaptable, which allows changing the voltage level supplied to the memory based on the error rate of the memory. Hybrid memory buffer 800 includes adaptive power logic 848. Adaptive power logic 848 may communicate with an integrated VR 850 to chain the supply voltage 802 that is supplied to the strata on the stack (852). In many embodiments, the adaptive power logic 848 may increment voltage on a step by step basis or decrement voltage the same way where each step is a certain delta voltage value. In other embodiments that are not shown, the VR is not integrated into the hybrid memory buffer 800 but rather is a discrete VR on the package substrate (118 in FIG. 1) or elsewhere in the computer system.

In some embodiments, voltage may be separately supplied to each memory tile in the hybrid memory device (such as memory tile 202 in FIG. 2). In other embodiments, voltage may be supplied to each memory strata (such as memory strata 204 in FIG. 2). In yet other embodiments, voltage may be uniformly supplied to the entire memory device, which includes the entire stack of memory strata (such as memory device 200 in FIG. 2).

The hybrid memory buffer 800 may also include adaptive refresh logic 854, which may be operable to change the refresh rate to the memory. The adaptive refresh logic 854 may be capable of increasing or decreasing the refresh rate of memory in steps, where each step is a delta of time. In different embodiments, the modification in refresh rate may be implemented on a memory tile basis, a memory strata basis, or an entire memory device basis, similarly to the different granularity embodiments described above for the adaptive power logic 848.

In many embodiments, built-in self test (BIST) logic implementing a linear feedback shift register (LFSR) 856 is present in the hybrid memory buffer. The BIST-LFSR logic 856 allows random patterns of data to be written across all of memory in the entire stack and read back for comparison. The BIST-LFSR logic has a seed value input that generates a continuously random pattern of data, each chunk of data can be written into each cache line in the memory stack. Then when reading the memory back to check for integrity, the same seed value may be input again to generate the same data.

Thus, the data, although random, is repeatable with the same seed value. Therefore, the random pattern created the second time may be compared, cache line by cache line, to the original data placed in memory. This allows for quick error checking across memory. If different seeds are placed and the entire memory is checked several times, those bits within memory that consistently show errors may be designated as having hard errors which are repeatable. The dynamic error workaround logic 836 may try one or more of several workarounds available to minimize errors.

Some of the options the dynamic error workaround logic 836 has to minimize the impact of problematic memory cells include logic components that have been discussed above, such as ECC 838, redundancy control logic 840, cache line disable logic 844, as well as potentially increasing power delivered to the cells through adaptive power logic 848 and/or decreasing the time between memory refreshes with adaptive refresh logic 854.

Figure 10:
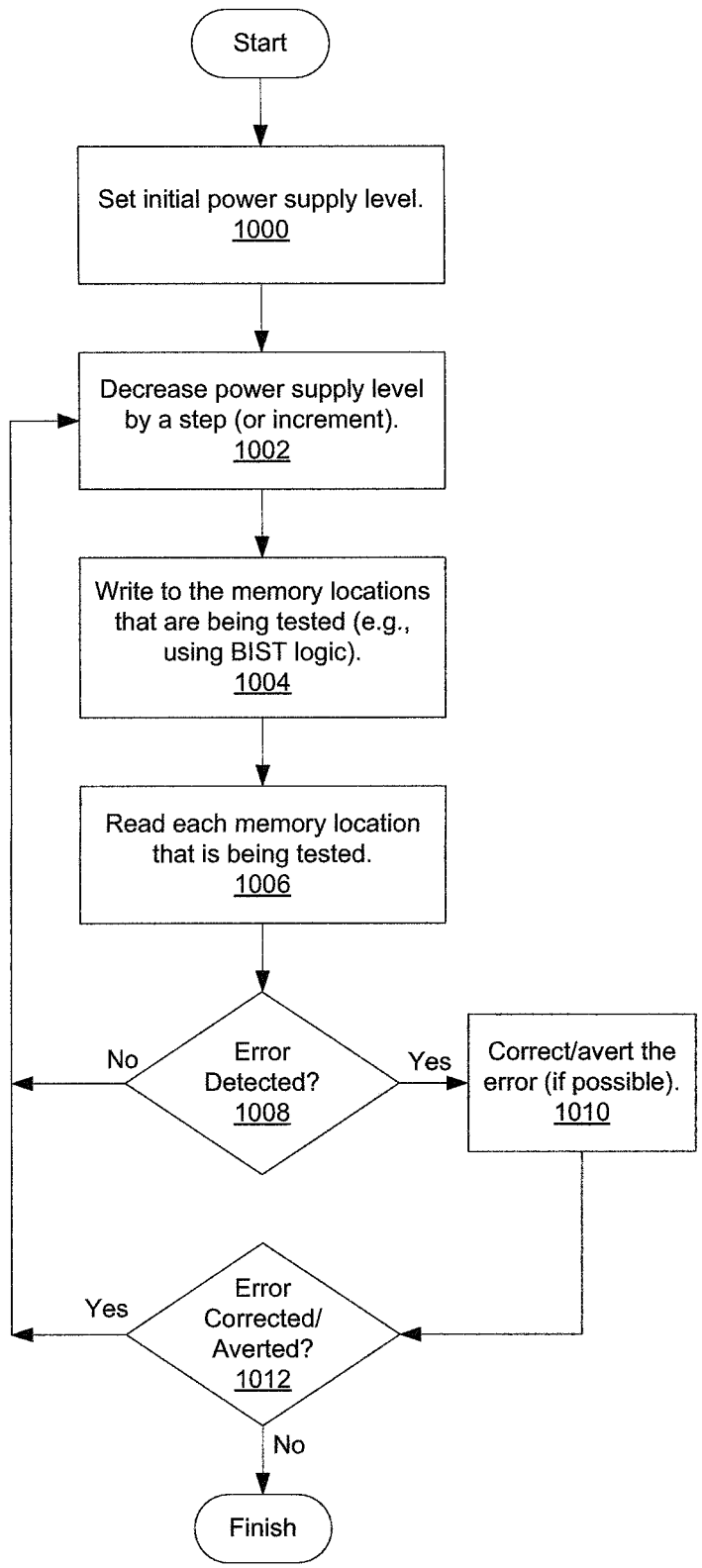
FIG. 10 is a flow diagram of an embodiment of a process utilizing adaptive power logic to optimize the power delivered to the hybrid memory device.

FIG. 10 is a flow diagram of an embodiment of a process utilizing adaptive power logic to optimize the power delivered to the hybrid memory device.

The process may be performed by processing logic that may comprise hardware (e.g., circuitry), software (e.g., an operating system), firmware (e.g., microcode), or a combination of any of the three types of processing logic listed.

The process begins by processing logic setting an initial power supply level (processing block 1000). In some embodiments, the initial power supply level may be a highest power level capable of being supplied. In other embodiments, the initial power supply level may be a standard supply level in the center of the recommended supply settings. In yet other embodiments, the initial power supply level may be set by a user in a basic input/output system (BIOS) setting for initialization.

Processing logic then decreases the power supply level from the current setting by a step or increment (processing block 1002). The delta in power supplied per increment may be predetermined based on the VR logic since many VRs have a table of voltage supply levels that can be stepped through using a different value input into a register or other storage location managed by the VR.

Once the power supply level has decreased by the increment, processing logic then performs tests on memory by writing to memory locations (processing block 1004). Processing logic may utilize a BIST-LFSR or another type of testing process. The memory locations tested may include all of memory in some embodiments. Though in other embodiments, dynamic error workaround logic (836 in FIG. 8) may have already determined a group of potentially faulty memory locations and a subset of all memory may be tested to determine workarounds for errors in the faulty locations only.

Then processing logic reads each memory location that has been tested (processing block 1006). Processing logic then determines whether an error has been detected (processing block 1008). In many embodiments, ECC or other similar error detection code is utilized to determine if one or more errors are present. If no errors are present, processing logic returns to block 1002 and further decreases the power supply level. Otherwise, if an error has been detected, processing logic attempts to correct the error or potentially avert the error (processing block 1010).

The set of steps utilized to correct or avert the error are implementation-specific, although the techniques may include: ECC for error correction, redundancy control and cache line disabling for error aversion, as well as potentially decreasing the time between memory refreshes. Furthermore, another option is to increase the power back up to the previous voltage level increment if the previous voltage level produced no error.

Processing logic then checks to see if the error was successfully corrected or averted (processing block 1012). If the error was successfully corrected or averted, processing logic may return to block 1002 to further decrease the power supply level.

In other embodiments that are not shown, the initial power supplied may be a low power level and the increments increase the power supplied rather than decrease the power supplied. In these embodiments, the initial test increments may exhibit a significant number of errors and the supply is increased until the errors dissipate.

In some embodiments, the adaptive power logic (848 in FIG. 8) performs these increment tests during initialization. In other embodiments, these tests are performed dynamically during operation to modify the power supplied to the memory stack. High bandwidth transfers between the hybrid memory stack and the hybrid memory buffer require higher power in general than during a refresh, thus power supplied to the memory may be dynamically lowered one or more increments during the refresh phase.

Once the refresh phase is complete and bandwidth is once again increased, the adaptive power logic 848 may increase the power one or more increments.

Figure 11:
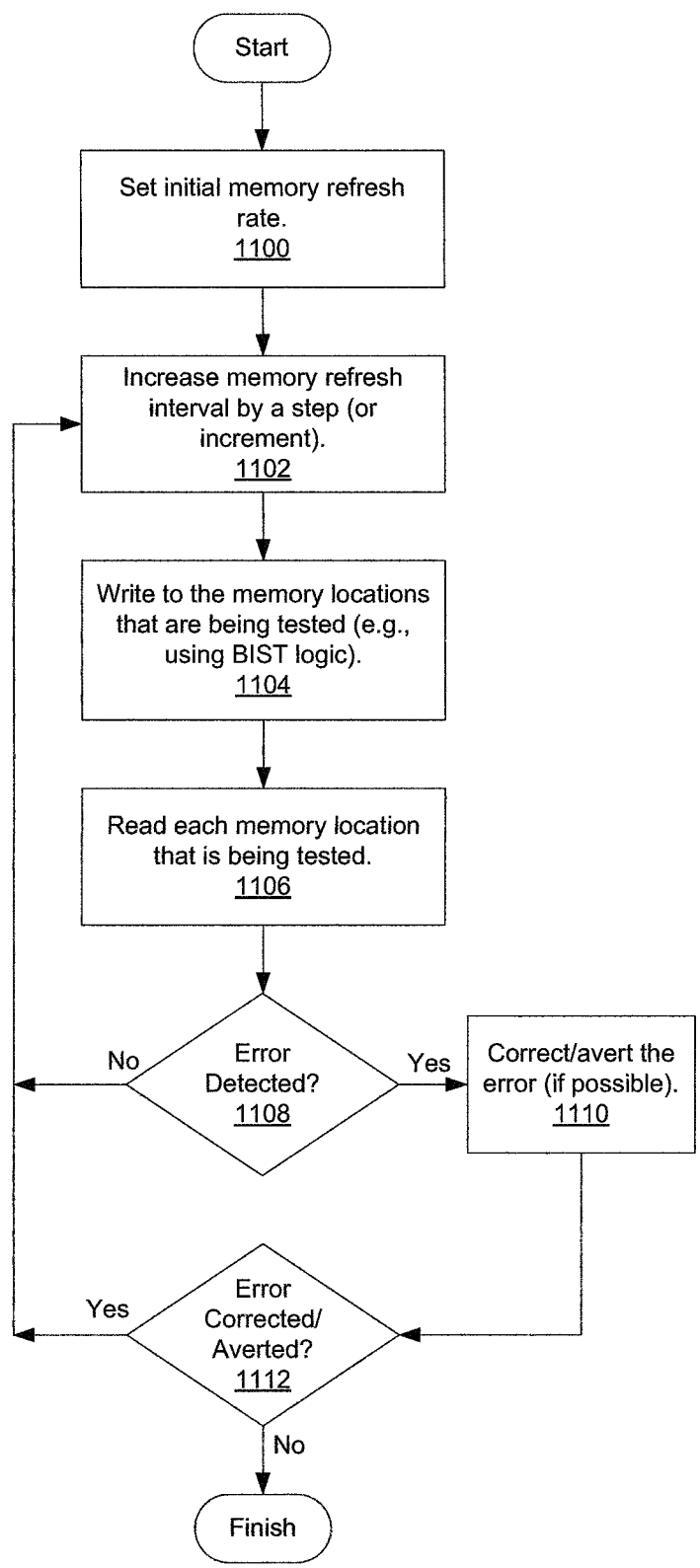
FIG. 11 is a flow diagram of an embodiment of a process utilizing adaptive refresh logic to optimize the power delivered to the hybrid memory device.

FIG. 11 is a flow diagram of an embodiment of a process utilizing adaptive refresh logic to optimize the power delivered to the hybrid memory device. Each time memory is refreshed, a certain amount of power is required to accomplish the refresh. Thus, if the refresh interval is increased, the overall power over time required by the memory is decreased.

The process may be performed by processing logic that may comprise hardware (e.g., circuitry), software (e.g., an operating system), firmware (e.g., microcode), or a combination of any of the three types of processing logic listed.

The process begins by processing logic setting an initial memory refresh rate (processing block 1100). In some embodiments, the initial refresh rate may be predetermined by a BIOS setting during initialization.

Processing logic then increases the memory refresh interval from the current setting by a step or increment (processing block 1102). The delta in time between refresh intervals may be a predetermined value or a value set by a user in the BIOS.

Once the refresh rate has increased by the increment, processing logic then performs tests on memory by writing to memory locations (processing block 1104).

Then processing logic reads each memory location that has been tested (processing block 1106). Processing logic then determines whether an error has been detected (processing block 1108). In many embodiments, ECC or other similar error detection code is utilized to determine if one or more errors are present. If no errors are present, processing logic returns to block 1002 and further increases the interval between refreshes. Otherwise, if an error has been detected, processing logic attempts to correct the error or potentially avert the error (processing block 1110).

Again, the set of steps utilized to correct or avert the error are implementation-specific, but may include ECC, redundancy control, cache line disabling decreasing the refresh rate interval or increasing the power supplied to the memory.

Processing logic then checks to see if the error was successfully corrected or averted (processing block 1112). If the error was successfully corrected or averted, processing logic may return to block 1102 to further increase the refresh rate interval.

Returning to FIG. 8, hybrid memory buffer 800 also may include a virtual page buffer 858. In many embodiments, the virtual page buffer 858 may store at least a portion of each currently opened page in the memory. It is common for memory access patterns to exhibit temporal and spatial locality. In the past, this locality was exploited by keeping the memory page open at each bank to reduce the latency and power of reopening a necessary page. However, given the multi-threaded operation of CPUs today, severe bank conflict may result. Given this problem, the virtual page buffer 959 may store a portion of each opened page in the hybrid memory buffer to reduce the chances of bank conflicts and so that the page may be accessed by a memory request. The hybrid memory buffer 800 enables this virtual open-page to both reduce power and latency and to increase bandwidth of the device.

Elements of embodiments of the present invention may also be provided as a machine-readable medium for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, propagation media or other type of machine-readable media suitable for storing electronic instructions. For example, embodiments of the invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the description above, certain terminology is used to describe embodiments of the invention. For example, the term "logic" is representative of hardware, firmware, software (or any combination thereof) to perform one or more functions. For instance, examples of "hardware" include, but are not limited to, an integrated circuit, a finite state machine, or even combinatorial logic. The integrated circuit may take the form of a processor such as a microprocessor, an application specific integrated circuit, a digital signal processor, a micro-controller, or the like.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

The invention claimed is:

1. An apparatus, comprising:
    a system in package comprising a stack of memory chips and a buffer die, the stack of memory chips stacked on the buffer die, the buffer die having an electronic connection interface on its topside to communicate with the stack of memory chips, each one of the memory chips being composed of multiple tiles of memory space across the memory chip's surface area, the stack of memory chips comprising a plurality of memory tile columns, each memory tile column composed of a set of vertically aligned tiles of the memory chips, each memory tile column composed of only one tile per memory chip, wherein each memory tile column has it own unique data channel, the system in package further comprising logic circuitry to adaptively change respective refresh rates applied to different memory chips such that the different ones of the memory chips are able to receive different refresh rates, and where, a unique refresh signal is generated for all tiles of a same memory chip.

2. The apparatus of claim 1 wherein the stack of memory chips and buffer die are communicatively coupled by way of through silicon vias.

3. The apparatus of claim 2 wherein the system in package further comprises redundancy control circuitry to shutdown a portion of the memory space of the stack of memory chips.

4. The apparatus of claim 1 wherein the buffer die further comprises built-in-self-test (BIST) logic circuitry to test the system in package.

5. The apparatus of claim 1 wherein the system in package is within a computer.

6. The apparatus of claim 5 wherein the stack of memory chips and buffer die are communicatively coupled by way of through silicon vias.

7. The apparatus of claim 6 wherein the system in package further comprises redundancy control circuitry to shutdown a portion of the memory space of the stack of memory chips.

8. The apparatus of claim 5 wherein the buffer die further comprises built-in-self-test (BIST) logic circuitry to test the system in package.

* * * * *